(12) United States Patent
Wang et al.

(10) Patent No.: US 11,711,252 B1
(45) Date of Patent: Jul. 25, 2023

(54) UTILIZING A FAST FOURIER TRANSFORM TO CANCEL A NON-LINEAR PHASE RESPONSE OF A DIGITAL INFINITE IMPULSE RESPONSE LOWPASS FILTER TO FACILITATE REMOVAL OF INTERFERENCE FROM TIME DOMAIN ORTHOGONAL FREQUENCY-DIVISION MULTIPLEXING BASED DIGITAL INPUT VALUES

(71) Applicant: Dell Products L.P., Round Rock, TX (US)

(72) Inventors: Lei Wang, Ottawa (CA); Tommy Ivarsson, Ottawa (CA)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 17/566,419

(22) Filed: Dec. 30, 2021

(51) Int. Cl.
*H04L 25/49* (2006.01)
*H04L 27/26* (2006.01)

(52) U.S. Cl.
CPC ...... *H04L 27/2627* (2013.01); *H04L 27/2605* (2013.01)

(58) Field of Classification Search
CPC .......... H04L 25/03159; H04L 27/2647; H04L 27/2672; H04W 16/14
(Continued)

(56) References Cited

U.S. PATENT DOCUMENTS 6,570,394 B1 * 5/2003 Williams ............... H04N 17/00
324/620
2010/0217790 A1 * 8/2010 Yang .................. H03H 21/0012
708/313
(Continued)

FOREIGN PATENT DOCUMENTS

CN 111083083 A 4/2020

OTHER PUBLICATIONS

Grover Rohan et al: "Reconfigurable wireless platforms for spectrally agile coexistence" 2014 IEEE International Symposium On Dynamic Spectrum Access Networks (Dyspan), IEEE, Apr. 1, 2014 (Apr. 1, 2014) pp. 458-466, XP032596053, DOI: 10.1109/DYSPAN. 2014.6817829 [retrieved on May 16, 2014] section III.B; figure 5, 9 pages.

(Continued)

*Primary Examiner* — Khai Tran
(74) *Attorney, Agent, or Firm* — Amin, Turocy & Watson, LLP

(57) ABSTRACT

Utilizing a fast Fourier transform (FFT) to cancel a non-liner phase response of a digital infinite impulse response (IIR) lowpass filter is presented herein. An apparatus generates, via the digital IIR lowpass filter, respective discrete time domain orthogonal frequency-division multiplexing (OFDM) based digital output values comprising non-linear phase distortion; in response to removing respective cyclic prefix values from the respective discrete time domain OFDM based digital output values to obtain a group of discrete time domain OFDM based digital output values, generates, based on such values via a digital FFT, respective frequency domain OFDM based digital output values comprising a non-linear phase response of the digital FFT; and based on the non-linear phase response of the digital IIR lowpass filter, applies phase compensation to the respective frequency domain OFDM based digital output values to obtain frequency compensated frequency domain OFDM based digital output values comprising a linear phase response.

20 Claims, 11 Drawing Sheets

(58) Field of Classification Search
USPC .................................................. 375/296, 260
See application file for complete search history.

(56) References Cited

U.S. PATENT DOCUMENTS

2020/0322201 A1* 10/2020 Kuchi ............... H04L 27/26412
2021/0336823 A1* 10/2021 Wada ..................... H04L 27/01
2022/0182172 A1* 6/2022 Nath ..................... H04L 1/0008

OTHER PUBLICATIONS

International Search Report and Written Opinion for PCT Application No. PCT/US2022/053059 dated Apr. 20, 2023, 26 pages.

* cited by examiner

UTILIZING A FAST FOURIER TRANSFORM TO CANCEL A NON-LINEAR PHASE RESPONSE OF A DIGITAL INFINITE IMPULSE RESPONSE LOWPASS FILTER TO FACILITATE REMOVAL OF INTERFERENCE FROM TIME DOMAIN ORTHOGONAL FREQUENCY-DIVISION MULTIPLEXING BASED DIGITAL INPUT VALUES

TECHNICAL FIELD

The subject disclosure generally relates to embodiments for utilizing a fast Fourier transform (FFT) to cancel a non-liner phase response of a digital infinite impulse response (IIR) lowpass filter to facilitate removal of interference from time domain orthogonal frequency-division multiplexing (OFDM) based digital input values.

BACKGROUND

5G New Radio (NR) receivers need to meet stringent interference conformance tests as required by 3$^{rd}$ Generation Partnership Project (3GPP) standards. To reduce the impact of such interference, and keep data throughput at optimal levels, conventional wireless technologies utilize digital lowpass finite impulse response (FIR) filters. FIR filters can be designed to have perfect linear phase response across the passband; however, in order to handle stringent narrow band blocking corresponding to 3GPP standard based conformance tests, the order of an FIR filter required to remove interference is very high—leading to high 5G NR receiver implementation costs. Further as the number of antenna branches in a 5G network increased to reap the benefits of multiple-input and multiple-output (MIMO) communication, the number of FIR filters used to remove interference will increase proportionally—further increasing 5G NR receiver implementation costs.

In comparison to a high-ordered FIR filter used to remove such interference, a low-ordered digital infinite impulse response (IIR) filter can achieve a magnitude response that is similar to that of the high-ordered FIR filter; however, the phase response of such IIR filter across the useful signal bandwidth is non-linear, which causes non-linear constellation rotation for the demodulation of an OFDM signal—significantly degrading system throughput. Consequently, conventional OFDM technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
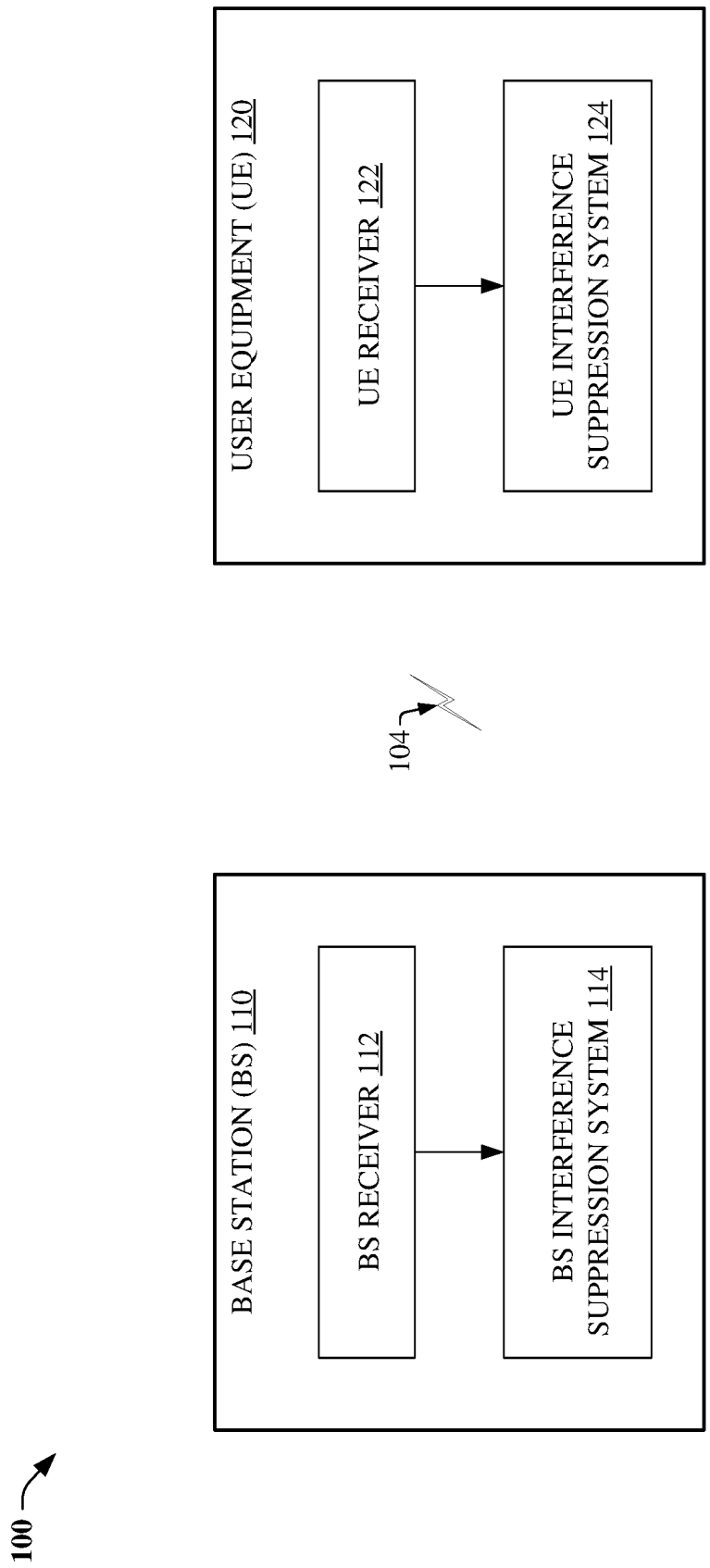
FIG. 1 illustrates a block diagram of a wireless communication environment including a base station and a user equipment (UE) having respective interference suppression systems that utilize respective FFTs to cancel non-linear phase responses of respective digital IIR lowpass filters of such systems, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional communication technologies utilizing digital FIR filters to perform stringent narrow band blocking corresponding to 3GPP standard based conformance tests require high ordered FIR filters—leading to high 5G NR receiver implementation costs, especially in MIMO communication environments. Further, use of low-ordered digital IIR filters to perform such narrow band blocking causes non-linear constellation rotation for the demodulation of an OFDM signal—significantly degrading system throughput.

On the other hand, various embodiments disclosed herein can facilitate removal of interference from time domain OFDM based digital input values, e.g., corresponding to 5G NR based systems, by utilizing an FFT to cancel a non-linear phase response of a digital IIR lowpass filter of such systems.

For example, an apparatus, e.g., a base station, an evolved Node B (eNB), a UE, or other OFDM based device, can comprise an IIR component that, based on time domain OFDM based digital input values corresponding to respective analog input signals, generates, via a digital IIR lowpass filter comprising a first non-linear phase response, respective discrete time domain OFDM based digital output values comprising non-linear phase distortion.

The apparatus further comprises a cyclic prefix (CP) removal and FFT component that, in response to removing respective CP values from the respective discrete time domain OFDM based digital output values to obtain a group of discrete time domain OFDM based digital output values, generates, based on the group of discrete time domain OFDM based digital output values via a digital FFT, respective frequency domain OFDM based digital output values comprising a second non-linear phase response corresponding to the first non-linear phase response of the digital IIR lowpass filter.

In turn, the apparatus further comprises a phase compensation component that, based on the first non-linear phase response of the digital IIR lowpass filter, applies phase compensation to the respective frequency domain OFDM based digital output values to obtain frequency compensated frequency domain OFDM based digital output values comprising a linear phase response represented by a defined amount of phase correction of the second non-linear phase response.

In other embodiment(s), a method comprises: obtaining, by an apparatus, e.g., base station, eNB, UE, or other OFDM based device, time domain based digital input values corresponding to respective wireless communication channels; based on the time domain based digital input values, generating, by the apparatus via a digital IIR lowpass filter comprising a first non-linear phase response, respective groups of discrete time domain based output values comprising non-linear phase distortion corresponding to the first non-linear phase response; removing, by the apparatus, CP values corresponding to the respective groups of discrete time domain based output values; and generating, by the apparatus based on the respective groups of discrete time domain based output values using a digital FFT, frequency domain based digital output values comprising a second non-linear phase response corresponding to the non-linear phase distortion of the discrete time domain based output values.

Further, the method comprises: based on the first non-linear phase response of the digital IIR lowpass filter, determining, by the apparatus, respective phase compensation factors for the frequency domain based digital output values to facilitate correction of the second non-linear phase response corresponding to the non-linear distortion of the discrete time domain output values; and based on the respective phase compensation factors and the frequency domain based digital output values, determining, by the apparatus, complex frequency domain based digital output values comprising a linear phase response that satisfies a defined linearity condition with respect a defined amount of correction of the second non-linear phase response corresponding to the non-linear distortion of the discrete time domain output values.

In yet other embodiment(s), a non-transitory machine-readable medium comprising instructions that, in response to execution, cause a system comprising a processor to perform operations, the operations comprising: filtering, via a digital IIR low-pass filter, interference signals from time domain based OFDM digital input values to obtain time domain based OFDM digital output values—the digital IIR low-pass filter introducing first non-linear phase distortion into the time domain based OFDM digital output values; converting, via a digital FFT, the time domain based OFDM digital output values into frequency domain based OFDM digital output values comprising second non-linear phase distortion corresponding to the first non-linear phase distortion that has been introduced via the digital IIR low-pass filter; and based on the first non-linear phase distortion that has been introduced via the digital IIR low-pass filter, correcting the second non-linear phase distortion to obtain a linear phase response of the frequency domain based OFDM digital output values, the linear phase response represented by a defined amount of phase correction of the second non-linear phase distortion.

As described above, 5G NR receivers need to meet stringent interference conformance tests as required by 3GPP. To reduce the impact of the interference and keep the throughput at optimal level(s), conventional technologies use digital lowpass FIR filters. FIR filters can be designed to have perfect linear phase response across the passband, however, in order to handle 3GPP based stringent narrow band blocking conformance tests, the order of such FIR filters is very high—leading to high cost in the hardware implementation in a 5G NR receiver. Further, as the number of antenna branches in 5G networks increases to reap the benefit of MIMO based communications, the number of FIR filters increases proportionally, leading to a much higher cost in the receiver implementation.

In comparison to FIR filters, very low ordered IIR filters can achieve similar magnitude response to the FIR filters with respect to removing interference. However, the phase response of an IIR lowpass filter across the useful signal bandwidth is non-linear, which causes non-linear constellation rotation for the demodulation of a corresponding OFDM signal, and thus would degrade system throughput significantly. As a result, it is not desirable to use IIR filters in a receiver to facilitate removal of interference.

In 5G NR networks under the Open Radio Access network (O-RAN) framework, the split of layer 1 (L1) processing between an O-RAN Distributed Unit (O-DU) and an O-RAN Radio Unit (O-RU) gives rise to new possibilities of handling interference. In L1 functional split option 7.2a between O-DU and O-RU in the ORAN specification, the FFT engines are moved from the O-DU into the O-RU. This provides a great opportunity to cancel the non-linearity of the IIR phase response easily in the frequency domain with existing FFT engines. Since only frequency samples are transmitted through the ORAN fronthaul interface, there is no need for any additional messaging between O-DU and O-RU. By exploiting the knowledge of the IIR phase response at the frequency sampling points, the IIR phase response non-linearity can be corrected in the frequency domain to make the overall IIR phase response close to linear when perceived from the frequency domain samples, e.g., represented by a defined amount of phase correction corresponding to the IIR phase response non-linearity. The combination of the low-cost frequency domain equalization and sharp roll-off characteristic makes the IIR filter a very attractive option for interference rejection in O-RUs.

Figure 2:
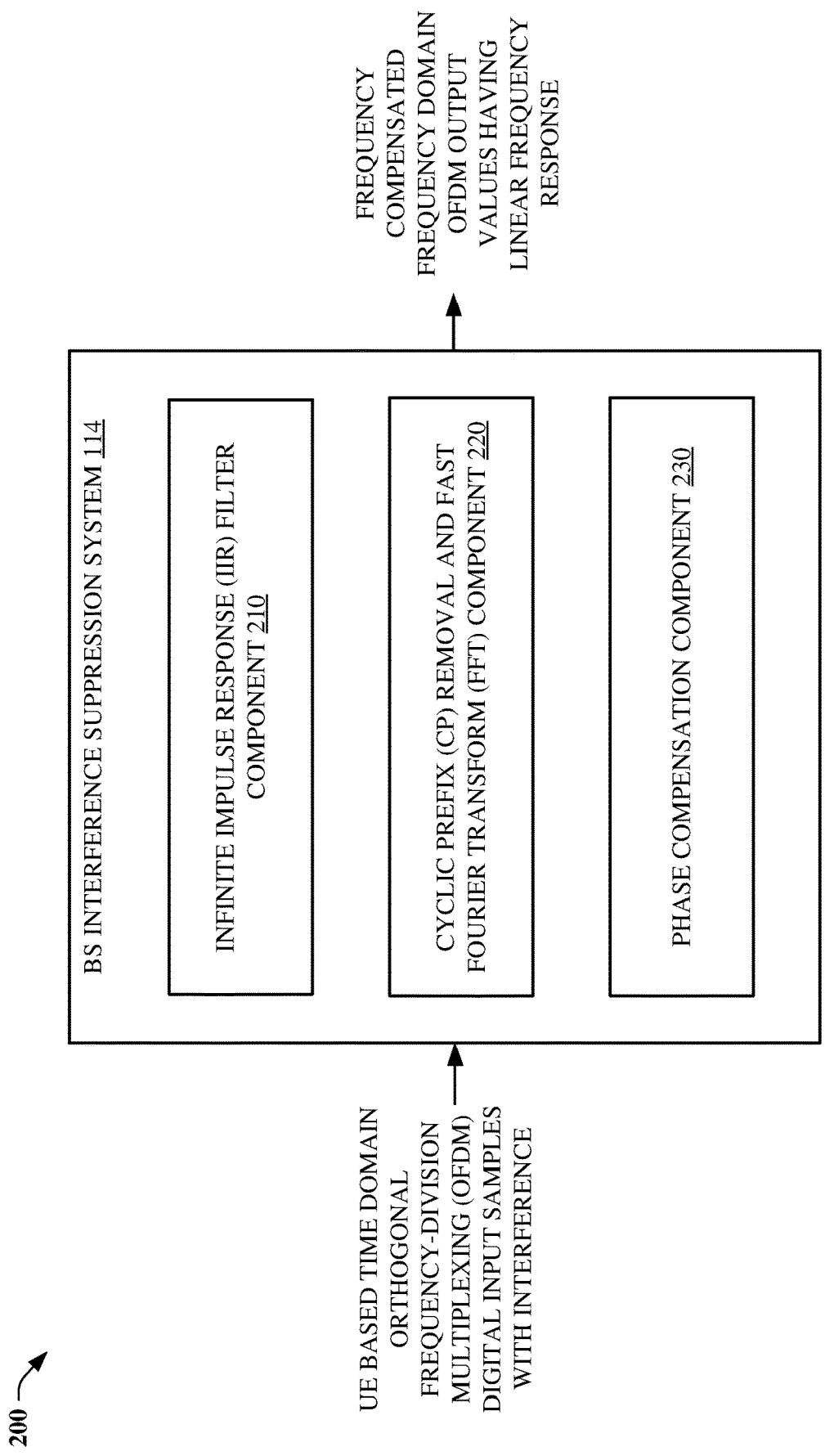
FIG. 2 illustrates a block diagram of a base station interference suppression system that utilizes an FFT to cancel a non-linear phase response of a digital IIR lowpass filter of such system, in accordance with various example embodiments.
Figure 3:
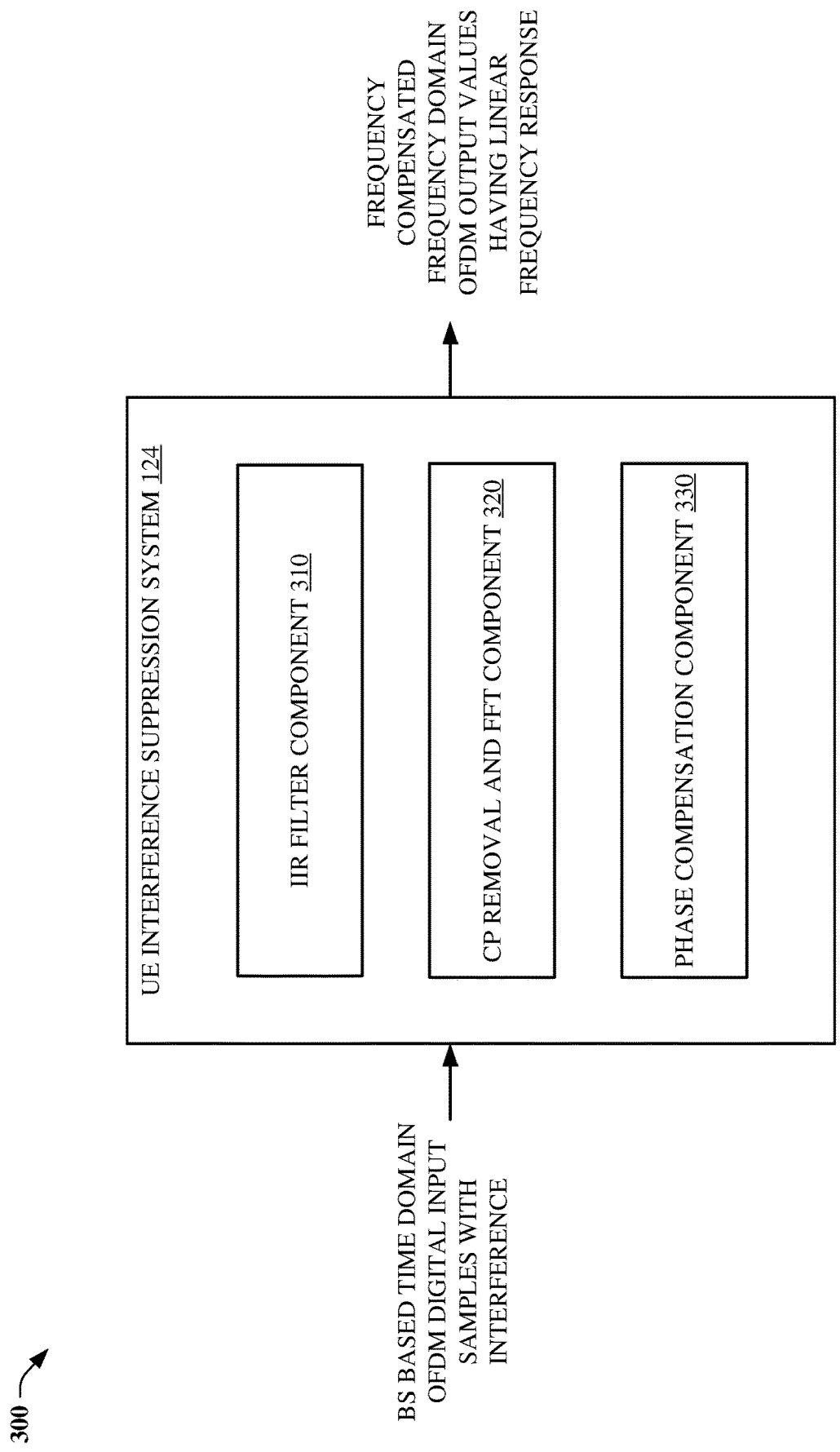
FIG. 3 illustrates a block diagram of a UE interference suppression system that utilize an FFT to cancel a non-linear phase response of a digital IIR lowpass filter of such system, in accordance with various example embodiments.
Figure 4:
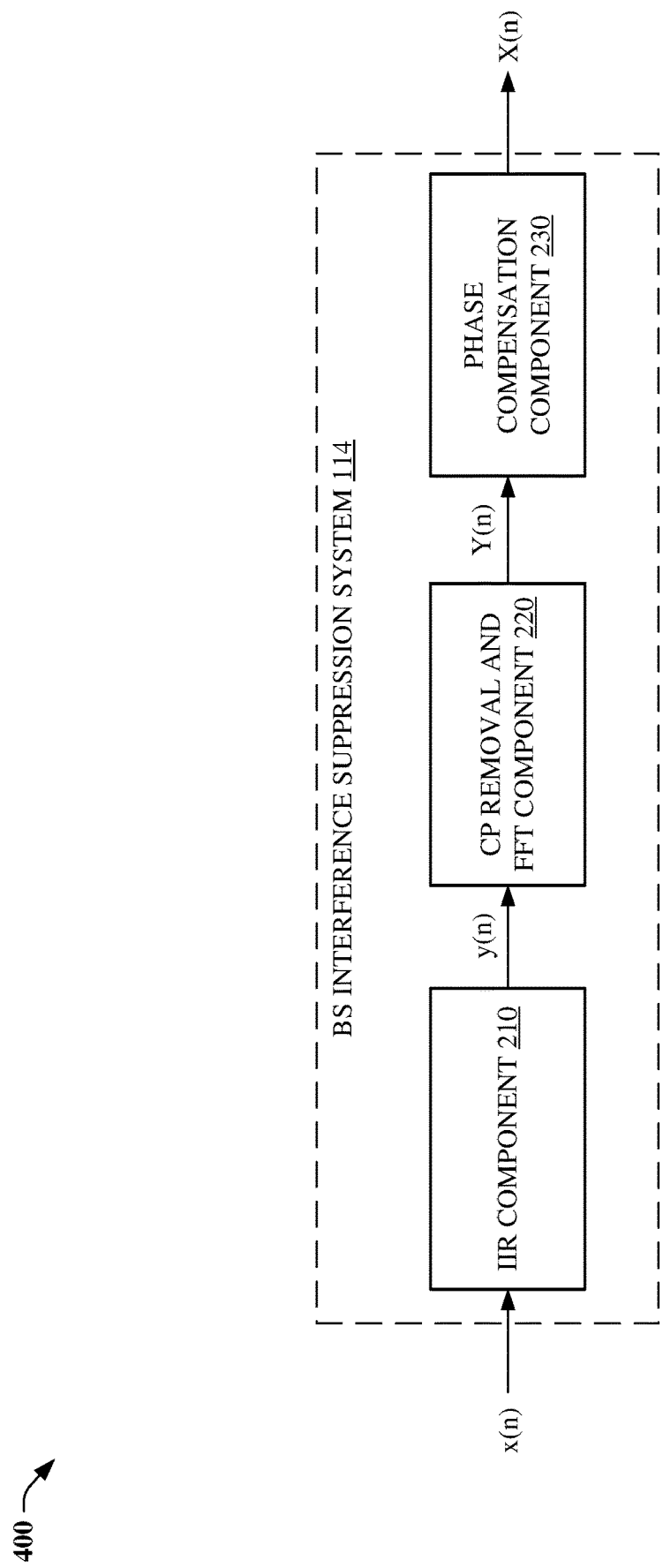
FIG. 4 illustrates another block diagram of a base station interference suppression system that utilizes an FFT to cancel a non-liner phase response of a digital IIR lowpass filter of such system, in accordance with various example embodiments.
Figure 5:
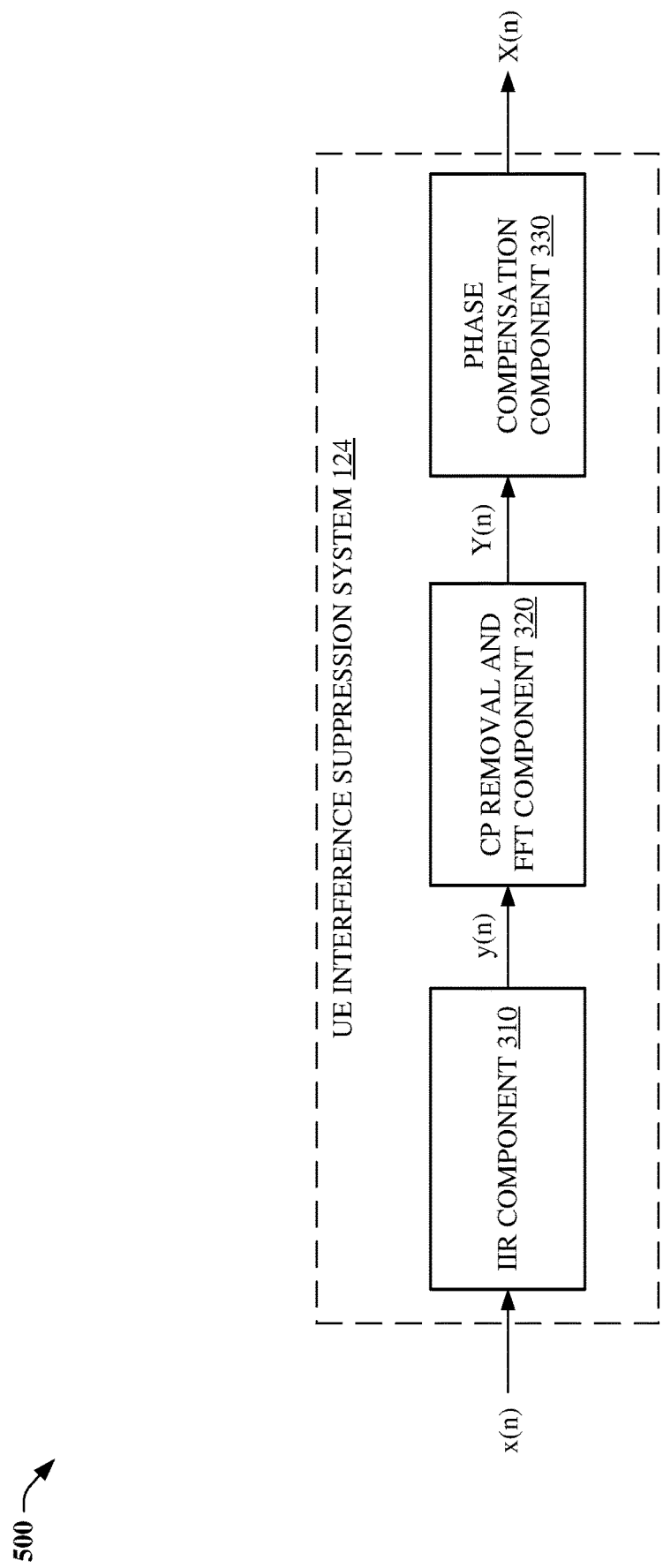
FIG. 5 illustrates another block diagram of a UE interference suppression system that utilizes an FFT to cancel a non-linear phase response of a digital IIR lowpass filter of such system, in accordance with various example embodiments.

Referring to FIGS. 1-5, block diagrams of a wireless communication environment (100) including a BS (110), e.g., network equipment, and a UE (120), e.g., wireless mobile device, having respective interference suppression systems (114, 124) that utilize respective FFTs to cancel non-linear phase responses of respective digital IIR lowpass filters of such systems are illustrated, in accordance with various example embodiments. As illustrated by FIGS. 4-5, each interference suppression system (114, 124) includes an IIR filter component (210, 310), a CP removal and FFT component (220, 320), and a phase compensation component (230, 330).

The IIR filter component, receives time domain OFDM based digital input values ("x(n)") corresponding to respective analog input signals, and generates, based on such time domain OFDM values via a digital IIR lowpass filter comprising an IIR non-linear phase response, respective discrete time domain OFDM based digital output values ("y(n)") comprising non-linear phase distortion.

In an embodiment illustrated by FIG. 2, the time domain OFDM based digital input values are UE based time domain OFDM digital input samples with interference that are received by a BS interference suppression system (114) of the BS. In this regard, the UE based time domain OFDM digital input samples include respective time domain complex numbers comprising respective in-phase portions and respective quadrature portions. Further, the UE based time domain digital input samples correspond to OFDM based analog input signals comprising wireless communication channels that are received via a BS receiver (112) using an over-the-air wireless link (104) of a radio access network (RAN) of the wireless communication environment (100). In embodiment(s), the BS generates, using the OFDM based analog input signals, the UE based time domain OFDM based digital input samples.

In another embodiment illustrated by FIG. 3, the time domain OFDM based digital input values are BS based time domain OFDM digital input samples with interference that are received by a UE interference suppression system (124) of the UE. In this regard, the BS based time domain OFDM digital input samples include respective time domain complex numbers comprising respective in-phase portions and respective quadrature portions. Further, the BS based time domain digital input samples correspond to OFDM based analog input signals comprising wireless communication channels that are received via a UE receiver (122) using the over-the-air wireless link (104) of the RAN of the wireless communication environment (100). In embodiment(s), the UE generates, using the OFDM based analog input signals, the BS based time domain OFDM based digital input samples.

In embodiment(s), the wireless communication environment utilizes cellular wireless technologies, e.g., 4G, 5G, and beyond; 3GPP UMTS; high speed packet access (HSPA); 3GPP LTE; third generation partnership project 2 (3GPP2); ultra-mobile broadband (UMB); LTE-A; etc. corresponding to the RAN that comprises the BS and UE.

Further, the over-the-air wireless link can comprise a downlink (DL) and an uplink (UL) (both not shown) that can utilize a predetermined band of radio frequency (RF) spectrum associated with, e.g., 4G, 5G, and beyond; cellular; LTE; LTE advanced (LTE-A); GSM; 3GPP universal mobile telecommunication system (UMTS); Institute of Electrical and Electronics Engineers (IEEE) 802.XX technology (WiFi, Bluetooth, etc.); worldwide interoperability for microwave access (WiMax); a wireless local area network (WLAN); Femto; near field communication (NFC); Wibree; Zigbee; satellite; WiFi Direct; etc. Accordingly, the RAN can be associated with RF spectrums corresponding to respective types of wireless technologies including, but not limited to, cellular, WiFi, WiMax, WLAN, Femto, NFC, Wibree, Zigbee, satellite, WiFi Direct, etc.

In embodiment(s), the IIR filter component includes a digital IIR lowpass filter comprising a pair of digital real coefficient IIR filters,. In this regard, a first filter of the pair of digital real coefficient IIR filters corresponds to the respective in-phase portions of the respective time domain complex numbers; and a second filter of the pair of digital real coefficient IIR filters corresponds to the respective quadrature portions of the respective time domain complex numbers. In other embodiment(s), the pair of digital real coefficient IIR filters are implemented utilizing respective cascaded second order segments.

For example, the IIR filter component includes a real coefficient based lowpass IIR filter that applies to the in-phase Re{x(n)} and quadrature part Im{x(n)} of the complex signal x(n) separately. The real coefficient IIR filter can be described by the following transfer $$H(z) = \frac{b_0 + b_1 z^{-1} + \ldots + b_M z^{-M}}{a_0 + a_1 z^{-1} + \ldots + a_M z^{-M}}$$

function using coefficients $b_i$ and $a_i$ for i=0, 1, ..., M, where M is the order of the filter. The same transfer function can also be described by zeros $z_i$ and poles $p_i$. Many commercial and open source software package can be used to design the real coefficient lowpass IIR filter for interference removal.

Figure 6:
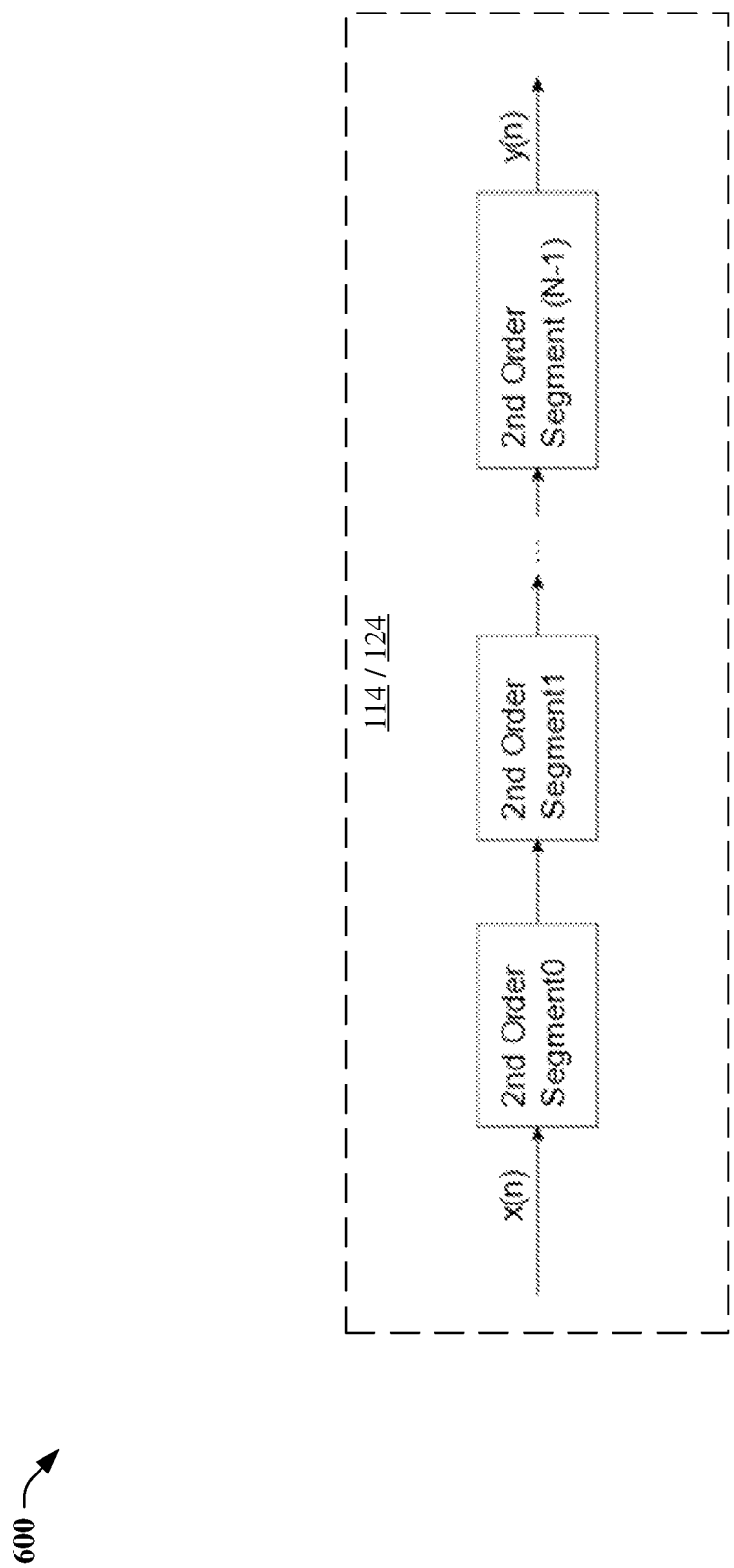
FIG. 6 illustrates a block diagram of a digital IIR lowpass filter of an interference suppression system that utilizes an FFT to cancel a non-linear phase response of the digital IIR lowpass filter, in accordance with various example embodiments.
Figure 7:
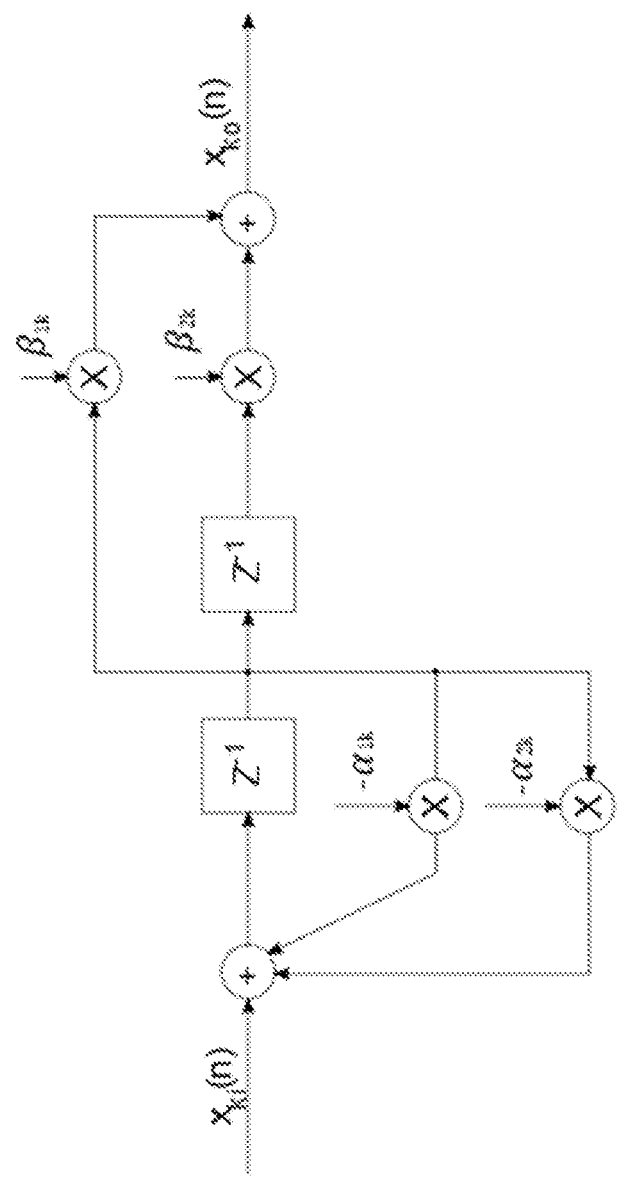
FIG. 7 illustrates a block diagram of a second order segment of a digital IIR lowpass filter of an interference suppression system that utilizes an FFT to cancel a non-linear phase response of the digital IIR lowpass filter, in accordance with various exampled embodiments.

The coefficients $b_i$ and $a_i$, zeros $z_i$ and poles $p_i$ are available, via the IIR filter component, in floating point format. For a particular real coefficient lowpass IIR filter, let P be the set of all poles, and Z be the set of all zeros, then we have $p_i \in P$, $Z_i \in Z$, for i=0, ..., M−1. The following procedure picks poles and zeros from set P and N to form subset $S_u$ i=0, 1, ..., N−1, where N is the total number of subsets:

1. For all Im{p}≥0, sort all p ∈ P by principle angle in ascending order $p^{(0)}, p^{(1)}, \ldots, p^{(M-1)}$
2. For all Im{z}≥0, sort all z ∈ Z by principle angle in descending order $z^{(0)}, z^{(1)}, \ldots, z^{(M-1)}$
3. For k=0, 1, ..., M−1, assign $p^{(k)}, \overline{p^{(k)}}, \overline{z^{(k)}}, z^{(k)}$ into subset $S_k$ as $p_{sk}, \overline{p_{sk}}, Z_{sk}, \overline{Z_{sk}}$ In In embodiment(s) illustrated by FIG. 6, the real coefficient lowpass IIR filter is implemented by N cascaded second order segments. Further, as illustrated by FIG. 7, each segment is described by the following transfer function and relationships:

$$H_k(z) = \frac{1 + \alpha_{1k} z^{-1} + \alpha_{2k} z^{-2}}{1 + \beta_{1k} z^{-1} + \beta_{2k} z^{-2}}$$

$$\beta_{1k} = -(p_{S_k} + \overline{p_{S_k}})$$

$$\beta_{2k} = p_{S_k} \overline{p_{S_k}}$$

$$\alpha_{1k} = -(z_{S_k} + \overline{z_{S_k}})$$

$$\alpha_{2k} = z_{S_k} \overline{z_{S_k}}$$

where k=0, 1, ..., N−1.

Figure 8:
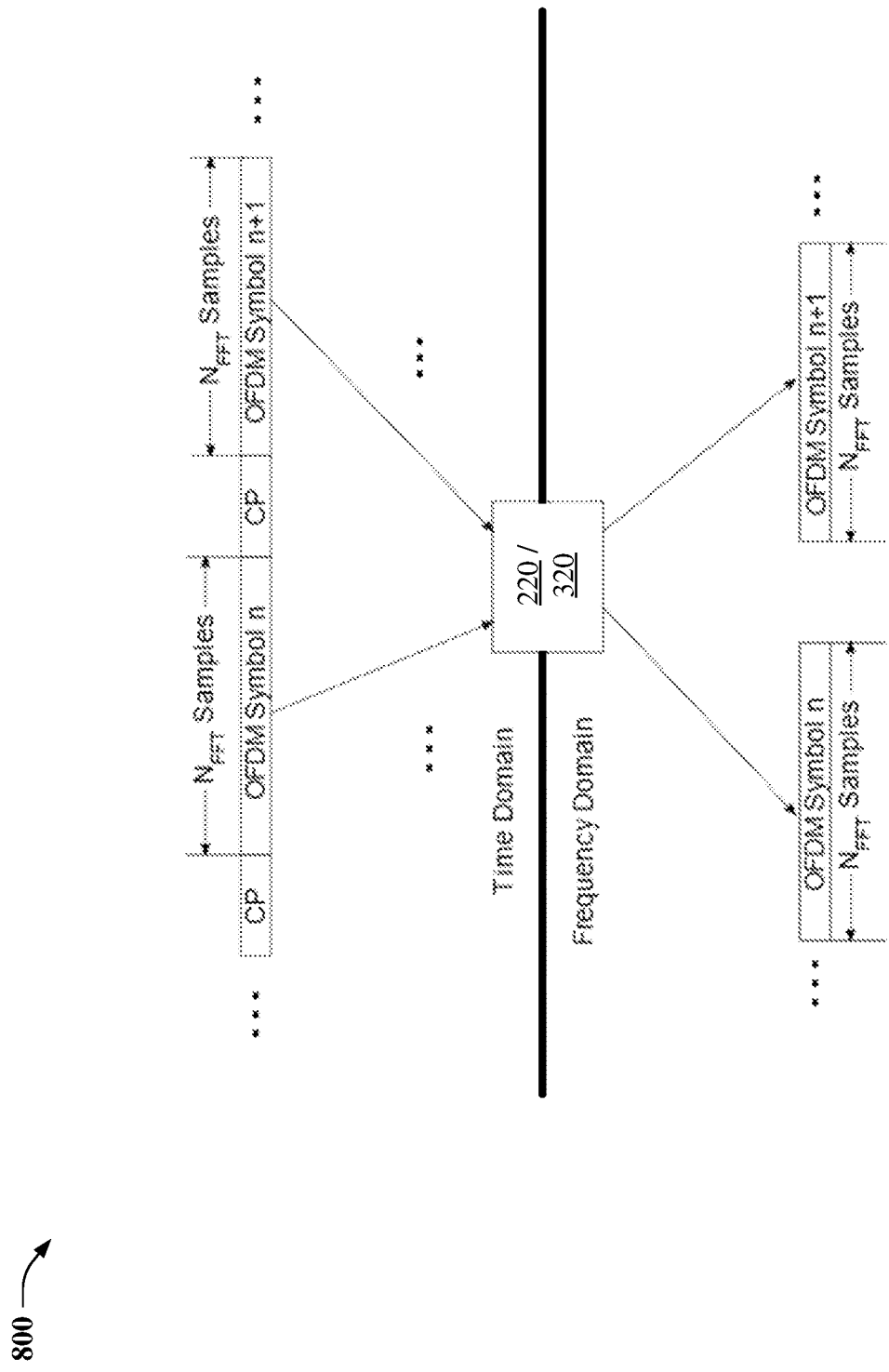
FIG. 8 illustrates a block diagram of a time domain and frequency domain structure of respective signals at an input and an output of a cyclic prefix removal and FFT component of a system that utilizes such component to cancel a non-linear phase response of a digital IIR lowpass filter of such system, in accordance with various example embodiments.

Referring now to FIG. 8, the CP removal and FFT component removes respective CP values from the respective discrete time domain OFDM based digital output values (y(n)) to obtain a group of discrete time domain OFDM based digital output values, and generates, based on the group of discrete time domain OFDM based digital output values via a digital FFT, respective frequency domain OFDM based digital output values ("Y(n)") comprising an FFT non-linear phase response corresponding to the IIR non-linear phase response.

In embodiment(s), the respective discrete time domain OFDM based digital output values (y(n)) include CP values corresponding to respective OFDM symbols n, n+1, etc. Further, the respective frequency domain OFDM based digital output values (Y(n)) correspond to $N_{FFT}$ samples corresponding to the respective OFDM symbols n, n+1, etc.

Figure 9:
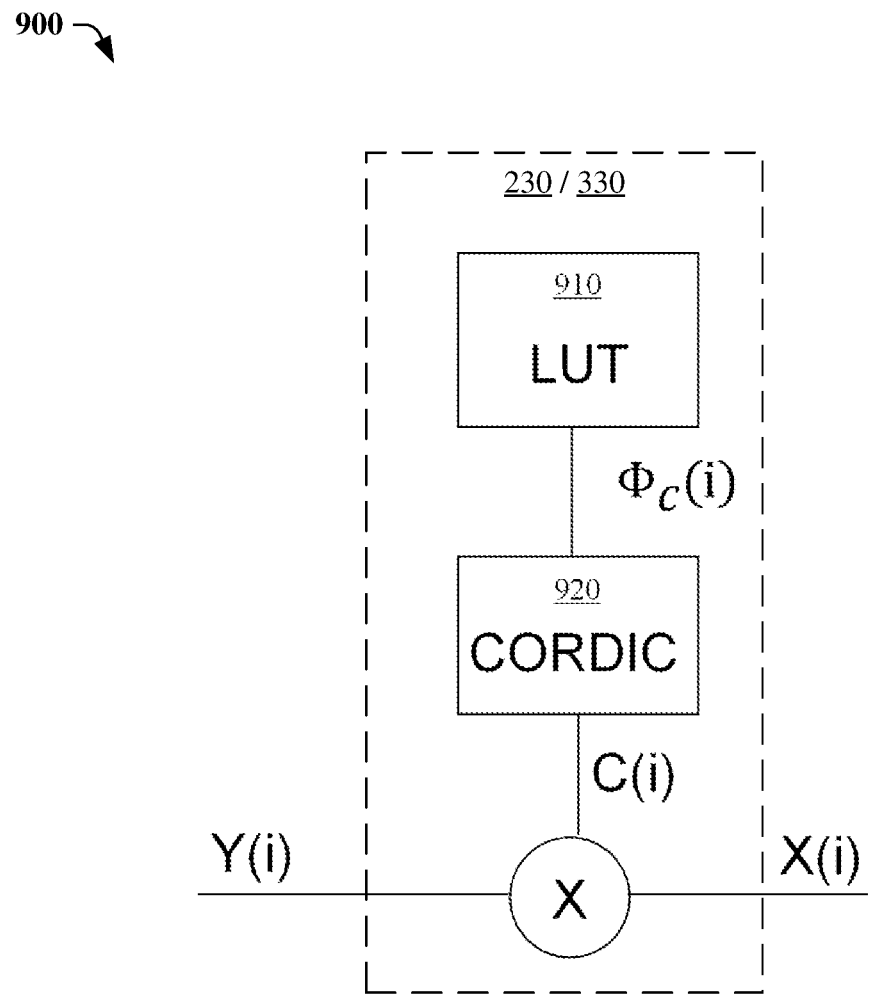
FIG. 9 illustrates a block diagram of a phase compensation component of an interference suppression system that utilizes an FFT to cancel a non-linear phase response of a digital IIR lowpass filter of such system, in accordance with various example embodiments.

As illustrated by FIG. 9, based on the IIR non-linear phase response, the phase compensation component applies phase compensation to the respective frequency domain OFDM based digital output values ("Y(i)") to obtain frequency compensated frequency domain OFDM based digital output values ("X(i)") comprising a linear phase response represented by a defined amount of phase correction of the FFT non-linear phase response.

In this regard, in embodiment(s), the phase compensation component determines an IIR inverse non-linear phase response that is opposite of the IIR non-linear phase response of the digital IIR lowpass filter. In turn, based on the IRR inverse non-linear phase response, the phase compensation component determines an FFT inverse non-linear phase response corresponding to the FFT non-linear phase response—the FFT inverse non-linear phase response being opposite, in phase, of the FFT non-linear phase response.

Further, the phase compensation component applies, in a frequency domain, the FFT inverse non-linear phase response to the respective frequency domain OFDM based digital output values (Y(n)) to facilitate cancelation of the non-linear phase distortion corresponding to the digital IIR lowpass filter.

For example, in embodiment(s), the phase compensation component determines, based on the IIR non-linear phase response of the digital IIR lowpass filter, respective phase compensation values for the respective frequency domain OFDM based digital output values (Y(n)). In turn, the phase compensation component applies the respective phase compensation values to the respective frequency domain OFDM based digital output values to obtain the frequency compensated frequency domain OFDM based digital output values ("X(n)").

In embodiment(s), the phase response of the digital lowpass IIR filter can be described as $$\Phi(\Omega) = \angle H(e^{j\Omega}) = \angle \frac{b_0 + b_1 e^{-j\Omega} + \ldots + b_M^{e^{-j\Omega M}}}{a_0 + a_1 e^{-j\Omega} + \ldots + a_M^{e^{-j\Omega M}}},$$

in which $\Phi(\Omega)$ can be computed numerically for all frequency points in the frequency range of interest B={Ω|−Ω$_{bw}$<Ω<Ω$_{bw}$}, where Ω$_{bw}$ is the normalized signal edge frequency. The phase compensator $\Phi_c(\Omega)$ is derived from $\Phi_c(\Omega)$=aπΩ−Φ(Ω), Ω∈B, in which a={−1, −2, . . . }is the target slope of the compensated phase as a function of frequency. For frequency range outside B, define $\Phi_c(\Omega)$=0, Ω∉B.

The CP removal and FFT component computes $N_{FFT}$ complex number $c_i$, i=0, 1, . . . , $N_{FFT}$ representing frequency points $$\Omega(i) = \frac{2\pi i}{N_{FFT}}, i = 0, 1, \ldots, N_{FFT}$$

for every OFDM symbol. The post compensation frequency domain samples can be described by $d_i=c_i e^{j\Phi c(\Omega(i))}$, i=0, 1, . . . , $N_{FFT}$.

The group delay of the digital lowpass IIR filter is $$D(\Omega) = \frac{d\Phi(\Omega)}{d\Omega}.$$

At frequency bin Ω(i), the group delay is D(Ω(i)). Let $L_{CP}$ be the length of CP values in samples, the following inequality $$L_{CP} \geq \max_i D(\Omega(i))$$

describes the minimum CP length needed for inter symbol interference (ISI) free compensation.

As illustrated by FIG. 9, for each frequency domain OFDM based digital output value Y(i), i=0, 1, . . . , $N_{FFT}$ the phase compensation component corrects such value by a corresponding phase correction factor $e^{j\Phi c(\Omega(i))}$ to obtain frequency compensated frequency domain OFDM based digital output value (X(i)) comprising a linear phase response represented by a defined amount of phase correction, e.g., within 1%, of the FFT non-linear phase response.

In embodiment(s), the phase compensation component stores a phase compensation factor $\Phi_c(\Omega(i))$ of the phase correction factor in a memory storage device, e.g. a, look-up table (LUT) (910), e.g., at a memory address corresponding to i.

In turn, a coordinate rotation digital computer (CORDIC) component (920) ("CORDIC") of the phase compensation component calculates $e^{j\Phi c(\Omega(i))}$ by its real part and imaginary part to form the phase correction factor as C(i)=$e^{j\Phi c(\Omega(i))}$=cos$\Phi_c(\Omega(i))$+jsin$\Phi_c(\Omega(i))$.

Further, the phase compensation component applies the phase correction factor to the frequency domain OFDM based digital output value (Y(i)) to obtain the frequency compensated frequency domain OFDM based digital output value (X(i)) comprising the linear phase response, e.g., represented by a defined amount, e.g., 99.99%, of phase correction of the FFT non-linear phase response; represented by a correction of the non-linear phase distortion of the IIR lowpass filter in the frequency domain sampling points to reverse, based on the defined amount of phase correction of the FFT non-linear phase response, a constellation rotation of a constellation representing the FFT non-linear phase response.

Figure 10:
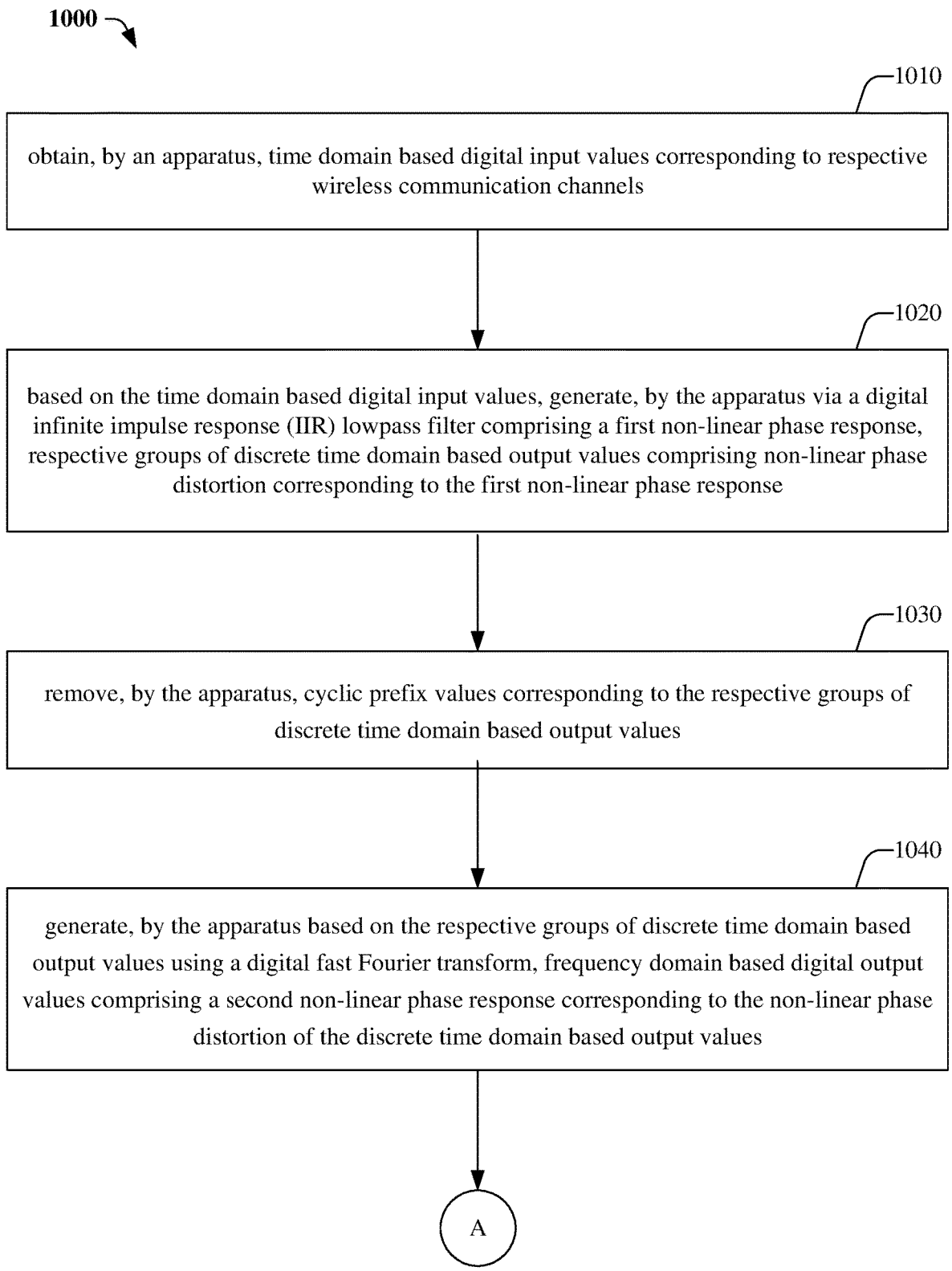
FIGS. 10-11 illustrate flow charts of a method performed by an interference suppression system that utilizes an FFT to cancel a non-linear phase response of a digital IIR lowpass filter of such system, in accordance with various example embodiments.
Figure 11:
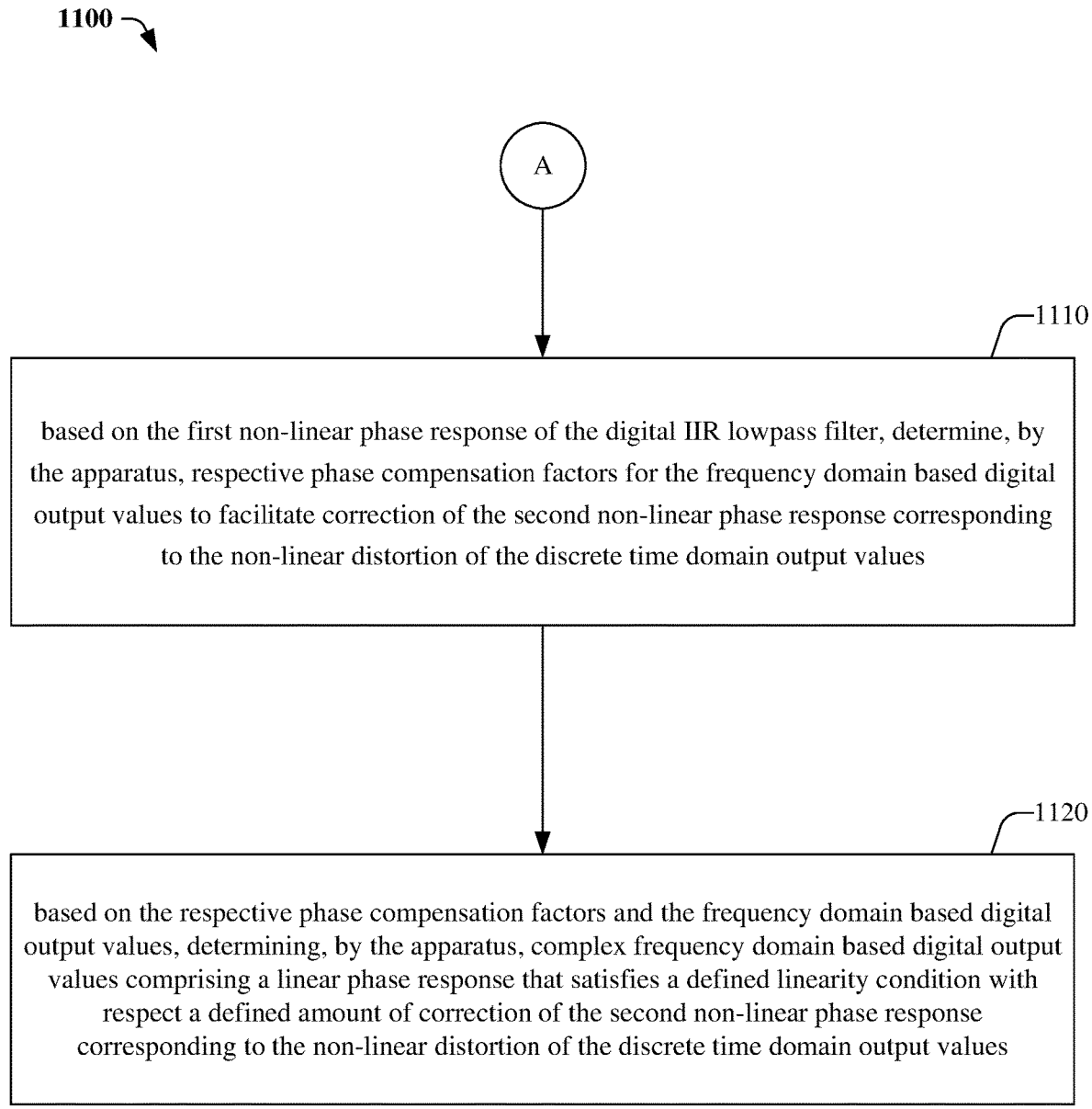

FIGS. 10-11 illustrate flow charts of a method performed by an interference suppression system (114, 124) that utilizes an FFT to cancel a non-linear phase response of a digital IIR lowpass filter of such system, in accordance with various example embodiments. For simplicity of explanation, the method is depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the method in accordance with the disclosed subject matter. In addition, those skilled in the art will understand and appreciate that the method could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring now to FIGS. 10-11, flow charts (1000 and 1100) of a method that facilitates cancelation, via an FFT, of a non-linear phase response of a digital IIR lowpass filter of an interference suppression system (114, 124) are illustrated, in accordance with various example embodiments. At 1010, an apparatus (e.g., 110, 120) obtains time domain based digital input values corresponding to respective wireless communication channels. At 1020, based on the time domain based digital input values, the apparatus generates, via a digital IIR lowpass filter comprising a first non-linear phase response, respective groups of discrete time domain based output values comprising non-linear phase distortion corresponding to the first non-linear phase response.

At 1030, the apparatus removes CP values corresponding to the respective groups of discrete time domain based output values. At 1040, the apparatus generates, based on the respective groups of discrete time domain based output values using a digital FFT, frequency domain based digital output values comprising a second non-linear phase response corresponding to the non-linear phase distortion of the discrete time domain based output values.

At 1110, based on the first non-linear phase response of the digital IIR lowpass filter, the apparatus determines respective phase compensation factors for the frequency domain based digital output values to facilitate correction of the second non-linear phase response corresponding to the non-linear distortion of the discrete time domain output values.

At 1120, based on the respective phase compensation factors and the frequency domain based digital output values, the apparatus determines complex frequency domain based digital output values comprising a linear phase response that satisfies a defined linearity condition with respect a defined amount of correction of the second non-linear phase response corresponding to the non-linear distortion of the discrete time domain output values.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As utilized herein, the terms "logic", "logical", "logically", and the like are intended to refer to any information having the form of instruction signals and/or data that may be applied to direct the operation of a processor. Logic may be formed from signals stored in a device memory. Software is one example of such logic. Logic may also be comprised by digital and/or analog hardware circuits, for example, hardware circuits comprising logical AND, OR, XOR, NAND, NOR, and other logical operations. Logic may be formed from combinations of software and hardware. On a network, logic may be programmed on a server, or a complex of servers. A particular logic unit is not limited to a single logical location on the network.

As utilized herein, terms "component", "system", and the like are intended to refer to an apparatus, a computer-related entity, hardware, software (e.g., in execution), and/or firmware. For example, a component can be embodied within hardware, such as an application specific integrated circuit (ASIC) or the like. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein.

In other embodiment(s), the terms "component", "system", and the like are intended to refer to a processor, a process running on a processor, an object, an executable, a program, a storage device, and/or a computer. By way of illustration, an application running on a server, client, etc. and the server, client, etc. can be a component. One or more components can reside within a process, and a component can be localized on one computer and/or distributed between two or more computers.

Further, components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. In yet another example, a component can be an apparatus that provides specific functionality through electronic components without mechanical parts; the electronic components can comprise one or more processors therein to execute software and/or firmware that confer(s), at least in part, the functionality of the electronic components.

Aspects of systems, apparatus, and processes explained herein can constitute machine-executable instructions embodied within a machine, e.g., embodied in a computer readable medium (or media) associated with the machine. Such instructions, when executed by the machine, can cause the machine to perform the operations described. Additionally, the systems, processes, process blocks, etc. can be embodied within hardware, such as an application specific integrated circuit (ASIC) or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can comprise, but are not limited to: random access memory (RAM); read only memory (ROM); electrically erasable programmable read only memory (EEPROM); flash memory or other memory technology (e.g., card, stick, key drive, thumb drive, smart card); solid state drive (SSD) or other solid-state storage technology; optical disk storage (e.g., compact disk (CD) read only memory (CD ROM), digital video/versatile disk (DVD), Blu-ray disc); cloud-based (e.g., Internet based) storage; magnetic storage (e.g., magnetic cassettes, magnetic tape, magnetic disk storage or other magnetic storage devices); a virtual device that emulates a storage device and/or any of the above computer-readable media; or other tangible and/or non-transitory media which can be used to store desired information. In this regard, the terms "tangible" or "non-transitory" herein as applied to storage, memory, or computer-readable media, are to be understood to exclude only propagating transitory signals per se as modifiers and do not relinquish rights to all standard storage, memory or computer-readable media that are not only propagating transitory signals per se.

As it is employed in the subject specification, the term "processor", "processing component", etc. can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "memory storage device", "data store", "data storage", "storage device", "storage medium", "memory component", and substantially any other information storage component relevant to operation and functionality of a system, component, and/or process, can refer to "memory components," or entities embodied in a "memory," or components comprising the memory. It will be appreciated that the memory components described herein can be either volatile memory or nonvolatile memory, or can comprise both volatile and nonvolatile memory.

By way of illustration, and not limitation, nonvolatile memory, for example, can be included in storage devices (e.g., 910). Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An apparatus, comprising:
   an infinite impulse response (IIR) component that, based on time domain orthogonal frequency-division multiplexing (OFDM) based digital input values corresponding to respective analog input signals, generates, via a digital IIR lowpass filter comprising a first non-linear phase response, respective discrete time domain OFDM based digital output values comprising non-linear phase distortion;
   a cyclic prefix (CP) removal and fast Fourier transform (FFT) component that, in response to removing respective CP values from the respective discrete time domain OFDM based digital output values to obtain a group of discrete time domain OFDM based digital output values, generates, based on the group of discrete time domain OFDM based digital output values via a digital FFT, respective frequency domain OFDM based digital output values comprising a second non-linear phase response corresponding to the first non-linear phase response of the digital IIR lowpass filter; and a phase compensation component that, based on the first non-linear phase response of the digital IIR lowpass filter, applies phase compensation to the respective frequency domain OFDM based digital output values to obtain frequency compensated frequency domain OFDM based digital output values comprising a linear phase response represented by a defined amount of phase correction of the second non-linear phase response.

2. The apparatus of claim 1, wherein the analog input signals comprise wireless communication channels.

3. The apparatus of claim 2, wherein the apparatus is network equipment comprising a receiver that receives, via the wireless communication channels, OFDM based analog input values, and wherein the apparatus, based on the OFDM based analog input values, generates the time domain OFDM based digital input values.

4. The apparatus of claim 2, wherein the apparatus is a user equipment comprising a receiver that receives, via the wireless communication channels, OFDM based analog input values, and wherein the apparatus, based on the OFDM based analog input values, generates the time domain OFDM based digital input values.

5. The apparatus of claim 1, wherein the time domain OFDM based digital input values comprise respective time domain complex numbers comprising respective in-phase portions and respective quadrature portions.

6. The apparatus of claim 5, wherein the digital IIR lowpass filter comprises a pair of digital real coefficient IIR filters, wherein a first filter of the pair of digital real coefficient IIR filters corresponds to the respective in-phase portions of the respective time domain complex numbers, and wherein a second filter of the pair of digital real coefficient IIR filters corresponds to the respective quadrature portions of the respective time domain complex numbers.

7. The apparatus of claim 6, wherein the pair of digital real coefficient IIR filters are implemented utilizing respective cascaded second order segments.

8. The apparatus of claim 1, wherein the phase compensation component:

determines a first inverse non-linear phase response that is opposite of the first non-linear phase response of the digital IIR lowpass filter;

based on the first inverse non-linear phase response, determines a second inverse non-linear phase response corresponding to the second non-linear phase response, wherein the second inverse non-linear phase response is opposite of the second non-linear phase response; and applying, in a frequency domain, the second inverse non-linear phase response to the respective frequency domain OFDM based digital output values to facilitate cancelation of the non-linear phase distortion corresponding to the digital IIR lowpass filter.

9. The apparatus of claim 1, wherein the phase compensation component:

determines, based on the first non-linear phase response of the digital IIR lowpass filter, respective phase compensation values for the respective frequency domain OFDM based digital output values; and applies the respective phase compensation values to the respective frequency domain OFDM based digital output values to obtain the frequency compensated frequency domain OFDM based digital output values.

10. A method, comprising:

obtaining, by an apparatus, time domain based digital input values corresponding to respective wireless communication channels;

based on the time domain based digital input values, generating, by the apparatus via a digital infinite impulse response (IIR) lowpass filter comprising a first non-linear phase response, respective groups of discrete time domain based output values comprising non-linear phase distortion corresponding to the first non-linear phase response;

removing, by the apparatus, cyclic prefix values corresponding to the respective groups of discrete time domain based output values;

generating, by the apparatus based on the respective groups of discrete time domain based output values using a digital fast Fourier transform, frequency domain based digital output values comprising a second non-linear phase response corresponding to the non-linear phase distortion of the discrete time domain based output values;

based on the first non-linear phase response of the digital IIR lowpass filter, determining, by the apparatus, respective phase compensation factors for the frequency domain based digital output values to facilitate correction of the second non-linear phase response corresponding to the non-linear distortion of the discrete time domain output values; and based on the respective phase compensation factors and the frequency domain based digital output values, determining, by the apparatus, complex frequency domain based digital output values comprising a linear phase response that satisfies a defined linearity condition with respect a defined amount of correction of the second non-linear phase response corresponding to the non-linear distortion of the discrete time domain output values.

11. The method of claim 10, wherein the time domain based digital input values comprise respective complex numbers comprising respective real portions and respective quadrature portions.

12. The method of claim 11, wherein the respective complex numbers represent respective orthogonal frequency-division multiplexing (OFDM) symbols.

13. The method claim 10, wherein the respective phase compensation factors comprise respective real number portions and respective imaginary number portions.

14. The method of claim 13, wherein the determining of the respective phase compensation factors further comprises:

for each symbol of the respective OFDM symbols, generating, over a defined frequency range, a phase compensation value corresponding to a defined slope of compensated phase as a function of frequency;

storing the phase compensation value in a storage device of the apparatus as a stored phase compensation value; and based on the stored phase compensation factor, determining a phase correction factor of the respective phase correction factors.

15. The method of claim 14, wherein the determining of the complex frequency domain based digital output values further comprises:
applying the phase correction factor to a frequency domain based digital output value of the frequency domain based digital output values to obtain a complex frequency domain based digital output value of the complex frequency domain based digital output values, the complex frequency domain based digital output value corresponding to the symbol of the respective OFDM symbols.

16. The method of claim 15, wherein the applying of the phase correction factor to the frequency domain based digital output value further comprises:
applying the phase correction factor to the frequency domain based digital output value to reverse, based on the defined amount of correction of the second non-linear phase response, a constellation rotation of a constellation representing the second non-linear phase response.

17. A non-transitory machine-readable medium comprising instructions that, in response to execution, cause a system comprising a processor to perform operations, the operations comprising:
in response to receiving orthogonal frequency-division multiplexing (OFDM) analog input values, generating, based on the OFDM analog input values, time domain based OFDM digital input values;
filtering, via a digital infinite impulse response (IIR) low-pass filter, interference signals from the time domain based OFDM digital input values to obtain time domain based OFDM digital output values, wherein the digital IIR low-pass filter introduces first non-linear phase distortion into the time domain based OFDM digital output values;
converting, via a digital fast Fourier transform, the time domain based OFDM digital output values into frequency domain based OFDM digital output values comprising second non-linear phase distortion corresponding to the first non-linear phase distortion that has been introduced via the digital IIR low-pass filter; and
based on the first non-linear phase distortion that has been introduced via the digital IIR low-pass filter, correcting the second non-linear phase distortion to obtain a linear phase response of the frequency domain based OFDM digital output values, the linear phase response represented by a defined amount of phase correction of the second non-linear phase distortion.

18. The non-transitory machine-readable medium of claim 17, wherein the converting further comprises:
removing cyclic prefix values from the time domain based OFDM digital output values.

19. The non-transitory machine-readable medium of claim 17, wherein the system is radio access network equipment comprising a receiver, and wherein the operations further comprise:
receiving, by the receiver via respective wireless communication channels, OFDM based analog input values; and
based on the OFDM based analog input values, generating the time domain based OFDM digital input values.

20. The non-transitory machine-readable medium of claim 17, wherein the time domain based OFDM digital input values comprise respective complex numbers comprising respective real portions and respective quadrature portions, and wherein the respective complex numbers represent OFDM symbols.

* * * * *